(12) United States Patent
Kuzuhara (10) Patent No.: US 6,255,673 B1
(45) Date of Patent: Jul. 3, 2001

(54) HETERO-JUNCTION FIELD EFFECT TRANSISTOR

(75) Inventor: Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/243,526

(22) Filed: Feb. 1, 1999

(30) Foreign Application Priority Data

Feb. 2, 1998 (JP) .................................................. 10-021061

(51) Int. Cl.$^7$ ....................... H01L 31/072; H01L 31/109; H01L 31/0328; H01L 31/0336
(52) U.S. Cl. ............................. 257/192; 257/194; 257/195; 438/172
(58) Field of Search .................................. 257/194, 192, 257/195; 438/172

(56) References Cited

U.S. PATENT DOCUMENTS

| | | | | |
|---|---|---|---|---|
| 5,504,353 | * | 4/1996 | Kuzuhara | 257/194 |
| 5,621,228 | * | 4/1997 | Ando | 257/192 |
| 5,641,977 | * | 6/1997 | Kanamori | 257/192 |
| 5,789,767 | * | 8/1998 | Omura | 257/194 |

FOREIGN PATENT DOCUMENTS

| | | |
|---|---|---|
| 2-285682 | 11/1990 | (JP) . |
| 5-47798 | 2/1993 | (JP) . |
| 5-152339 | 6/1993 | (JP) . |
| 6-104289 | 4/1994 | (JP) . |
| 8-222578 | 8/1996 | (JP) . |
| 9-45894 | 2/1997 | (JP) . |

* cited by examiner

Primary Examiner—William Mintel
(74) Attorney, Agent, or Firm—Hutchins, Wheeler & Dittmar (57) ABSTRACT

There is provided a hetero-junction field effect transistor including a multi-layered structure comprising a buffer layer, a channel layer composed of first semiconductor containing n-type impurity therein, a schottky layer composed of a second semiconductor including a forbidden band having a greater width than a width of a forbidden band of the first semiconductor, an electron donating layer composed of a third semiconductor which includes a forbidden band having a greater width than a width of a forbidden band of the first semiconductor, and further contains n-type impurity therein, a contact layer composed of the first semiconductor or a fourth semiconductor including a forbidden band having a smaller width than a width of a forbidden band of the first semiconductor, a gate electrode formed on an exposed surface of the schottky layer in a recess formed through the electron donating layer and the contact layer, and source and drain electrodes located around the gate electrode. The hetero-junction field effect transistor has a higher gate breakdown voltage, and a smaller source and drain resistance.

34 Claims, 4 Drawing Sheets

HETERO-JUNCTION FIELD EFFECT TRANSISTOR

BACKGROUND OF THE INVENTION

1. Field of the Invention

The invention relates to a hetero-junction field effect transistor, and more particularly to a hetero-junction field effect transistor having a smaller gate breakdown voltage and a smaller parasitic resistance.

2. Description of the Related Art

A field effect transistor (hereinafter, referred to simply as "FET") composed of compound semiconductor such as GaAs, is known to those skilled in the art as a high-powered transistor operating in a high frequency band. Among FETs, a schottky barrier metal-semiconductor junction type field effect transistor (hereinafter, referred to simply as "MESFET") has been widely put into practice. A MESFET is characterized by that a schottky layer, in with which schottky barrier metal makes contact, is composed of the same semiconductor such as GaAs, as the semiconductor of which a channel layer through which a channel current runs is composed.

A hetero-junction field effect transistor (hereinafter, referred to simply as "HFET") is also known to those skilled in the art as a transistor characterized by that a schottky layer is composed of semiconductor different from the semiconductor of which the channel layer is composed, as suggested, for instance, in Japanese Unexamined Patent Publication No. 5-47798 based on U.S. patent application Ser. No. 07/648091 filed by Paul Sania et al. on Jan. 27, 1992, and assigned to Texas Instruments Incorporated.

Figure 1:
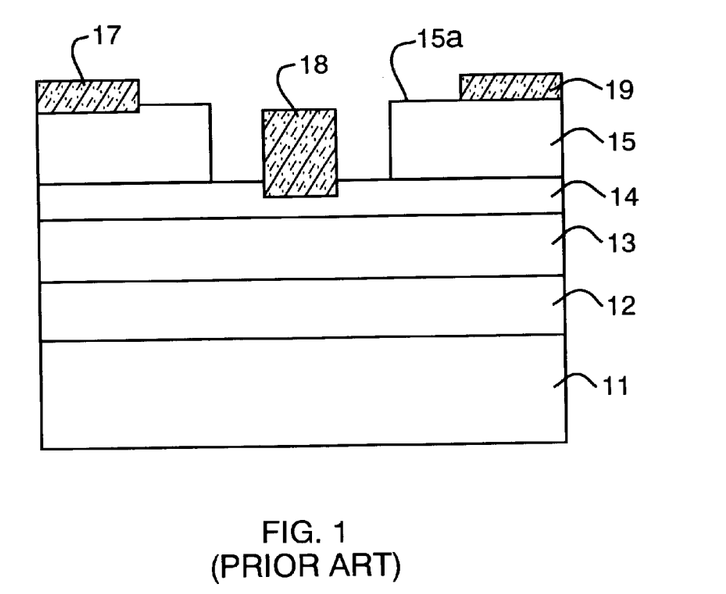
FIG. 1 is a cross-sectional view of a conventional hetero-junction field effect transistor.

FIG. 1 is a cross-sectional view of a conventional HFET. The illustrated HFET is comprised of a semi-insulating GaAs substrate 11, a buffer layer 12 formed on the GaAs substrate 11, an n-type GaAs channel layer 13 formed on the buffer layer 12, an n-type AlGaAs schottky layer 14 formed on the n-type GaAs channel layer 13, an n-type GaAs contact layer 15 formed on the n-type AlGaAs schottky layer 14 and formed with a recess 15a, a gate electrode 18 formed on the schottky layer 14 in the recess 15a, and a source electrode 17 and a drain electrode 19 both formed on the n-type GaAs contact layer 15 so that the gate electrode 18 is located between the source and drain electrodes 17 and 19.

In a HFET, a channel layer is composed of a first semiconductor having high electron mobility, such as GaAs, whereas a schottky layer is composed of a second semiconductor different from the first semiconductor and including a forbidden band having a great width, such as AlGaAs. Hence, the HFET could have a higher gate breakdown voltage with a maximum drain current allowed to run therethrough being kept constant.

An advantage of a HFET in which a greater amount of drain current and a higher gate breakdown voltage can be both obtained, is that the HFET is then suitable in particular for a micro-wave high-powered transistor.

In a conventional HFET as illustrated in FIG. 1, it was necessary for the n-type AlGaAs schottky layer 14 to have a relatively low impurity concentration in order to keep a gate breakdown voltage high. For instance, the n-type AlGaAs schottky layer 14 had to have an impurity concentration in the range of $5 \times 10^{16}$ to $2 \times 10^{17}$ cm$^{-3}$. This is because if the schottky layer had a high impurity concentration, the greater number of electrons would flow into semiconductor from a gate metal by virtue of the quantum tunnel effect, resulting in a reduction in a gate breakdown voltage.

Figure 2:
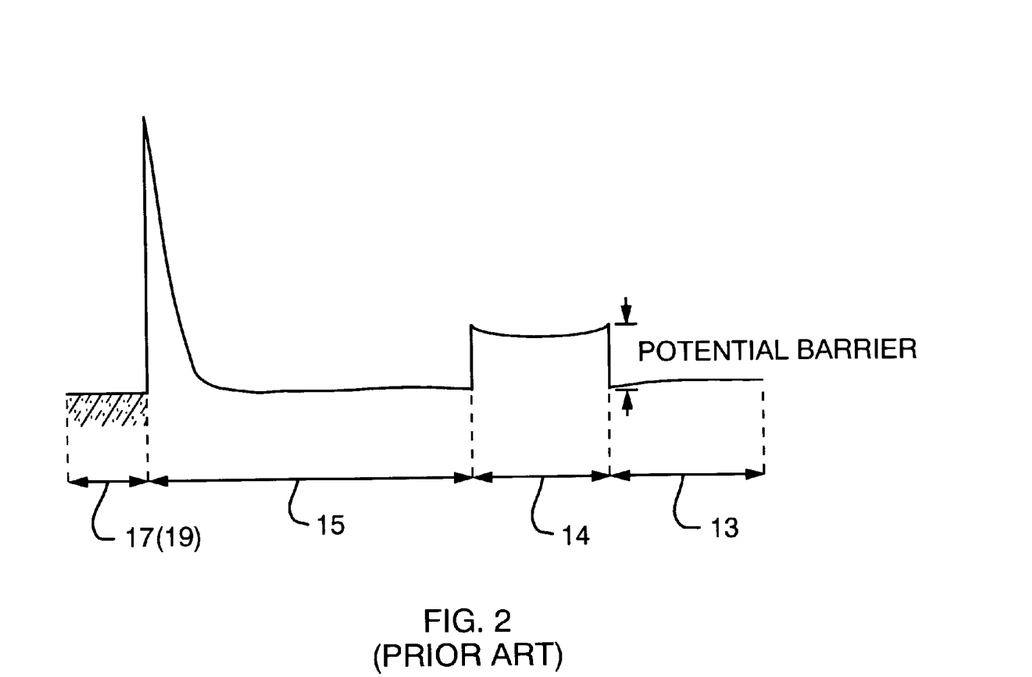
FIG. 2 is an energy band diagram of a conduction band located below an ohmic electrode in a conventional hetero-junction field effect transistor.

On the other hand, it was necessary for electrons to be transferred vertically through the n-type GaAs channel layer 13, through the n-type AlGaAs schottky layer 14, and through the n-type GaAs contact layer 15 to avoid electrical resistance in regions located below the source and drain electrodes 17 and 19. That is, a conventional HFET is accompanied with a problem that, as shown in FIG. 2, an energy band diagram, if the n-type AlGaAs schottky layer 14 has a relatively low impurity concentration, then a potential barrier over which electrons have to jump would be higher, which means that electrical resistance to electrons would be higher.

Since parasitic resistance in a region located below the source electrode 17 has a disadvantage of reducing mutual conductance which is quite important for the amplifying performance of FET, it is quite important to reduce such parasitic resistance.

In brief, a conventional HFET is accompanied by the problem that it is not possible to reduce a parasitic resistance, such as source or drain resistance, in the FET without also reducing the gate breakdown voltage.

Japanese Unexamined Patent Publication No. 5-152339 published on Jun. 18, 1993 has suggested a field effect transistor comprising a GaAs substrate, a GaAs layer formed on the GaAs substrate, a first n-type GaAs layer formed on the GaAs layer, a non-doped InGaAs layer formed on the first n-type GaAs layer, a second n-type GaAs layer formed on the non-doped InGaAs layer, a gate electrode formed on an exposed surface of the first n-type GaAs layer in a recess formed through the second n-type GaAs layer and the non-doped InGaAs layer, and source and drain electrodes both formed on the second n-type GaAs layer so that the gate electrode is located between the source and drain electrodes.

Japanese Unexamined Patent Publication No. 8-222578 published on Aug. 30, 1996 has suggested a field effect transistor comprising a non-doped InAlAs layer, a p-type InAlAs layer, a non-doped InAlAs layer, a non-doped InGaAs layer, a non-doped InAlAs layer, an n-type InAlAs layer, a non-doped InAlAs layer, an n-type InAlAs layer, and an n-type InGaAs layer, all of which are formed on a semi-insulating substrate in this order. A gate electrode is formed having a depth reaching the non-doped InAlAs layer. Source and drain electrodes are formed on the n-type InGaAs layer. A highly p-type impurity doped region is formed through the non-doped InAlAs layer, the non-doped InGaAs layer, the non-doped InAlAs layer, the n-type InAlAs layer, the non-doped InAlAs layer, the n-type InAlAs layer and the n-type InGaAs layer, reaching the p-type InAlAs layer. An ohmic electrode is formed on the highly p-type impurity doped region.

Japanese Unexamined Patent Publication No. 9-45894 published on Feb. 14, 1997 has suggested a method of fabricating a field effect transistor, comprising the steps of forming an i-GaAs buffer layer, an InGaAs electron transit layer, an n-type AlGaAs electron donating layer, an n-type InGaP spacer layer, and an n$^+$-type GaAs contact layer on a semi-insulating GaAs substrate in this order, forming source and drain electrodes, forming a photoresist film formed with an opening having a second recess pattern, etching the n$^+$-type GaAs contact layer with the photoresist film being used as a mask, etching the n-type InGaP spacer layer in a selected area to thereby form a first recess, side-etching the n$^+$-type GaAs contact layer in a selected area to thereby form the second recess, and forming a gate electrode by means of aluminum evaporation and lift-off.

However, the above-mentioned Publications are all accompanied with the problem mentioned earlier that they cannot reduce parasitic resistance such as source or drain resistance without reducing the gate breakdown voltage.

SUMMARY OF THE INVENTION

It is an object of the present invention to provide a field effect transistor capable of having a higher gate breakdown voltage and lower source and drain resistances.

There is provided a hetero-junction field effect transistor including (a) a buffer layer formed on a substrate, (b) a channel layer formed on the buffer layer and composed of a first semiconductor containing n-type impurity therein at least partially in a thickness-wise direction thereof, (c) a schottky layer formed on the channel layer and composed of a second semiconductor including a forbidden band having a greater width than a width of a forbidden band of the first semiconductor, (d) an electron donating layer formed on the schottky layer and having smaller electron affinity than that of the channel layer, (e) a contact layer formed on the electron donating layer and composed of one of the first semiconductor and a third semiconductor including a forbidden band having a smaller width than a width of a forbidden band of the first semiconductor, the contact layer containing n-type impurity therein, both the electron donating layer and the contact layer being formed with a recess such that the schottky layer appears, (f) a gate electrode formed on an exposed surface of the schottky layer in the recess, and (g) source and drain electrodes formed on the contact layer so that the gate electrode is located between the source and drain electrodes.

It is preferable that the schottky layer is formed at the exposed surface thereof with a second recess, where the gate electrode is positioned in the second recess.

It is preferable that a width of a forbidden band successively varies at both a first interface between the electron donating layer and the schottky layer and a second interface between the electron donating layer and the contact layer, in which case, the width of a forbidden band preferably decreases from the first interface to the second interface. This makes it possible to reduce a height of a potential barrier to be formed in the schottky layer and in the vicinity of the schottky layer, and cause the potential barrier to have a smooth profile.

For instance, the electron donating layer may be composed of fourth semiconductor having composition successively varying from the first interface to the second interface, in which case, it is preferable that the fourth semiconductor has the composition which is the same as composition of the second semiconductor in the vicinity of the first interface, and which is further the same as the composition of the third semiconductor in the vicinity of the second interface.

It is preferable that the contact layer is composed of one of GaAs and InGaAs, the schottky layer is composed of one of AlGaAs and InGaP, and the electron donating layer is composed of $Al_aGa_{1-a}As$ ($0 \leq a \leq 1$). As an alternative, the contact layer may be composed of one of GaAs and InGaAs, the schottky layer is composed of one of AlGaAs and InGaP, and the electron donating layer is composed of $In_bGa_{1-b}As_cP_{1-c}$ ($0 \leq b \leq 1$, $0 \leq c \leq 1$).

There is further provided a hetero-junction field effect transistor including (a) a buffer layer formed on a substrate, (b) a channel layer formed on the buffer layer and composed of a first semiconductor containing n-type impurity therein at least partially in a thickness-wise direction thereof, (c) a schottky layer formed on the channel layer and composed of a second semiconductor including a forbidden band having a greater width than a width of a forbidden band of the first semiconductor, (d) an electron donating layer formed on the schottky layer and composed of a third semiconductor including a forbidden band having a greater width than a width of a forbidden band of the first semiconductor, the third semiconductor containing n-type impurity therein at least partially in a thickness-wise direction thereof, (e) a contact layer formed on the electron donating layer and composed of one of the first semiconductor and a fourth semiconductor including a forbidden band having a smaller width than a width of a forbidden band of the first semiconductor, the contact layer containing n-type impurity therein, both the electron donating layer and the contact layer being formed with a recess such that the schottky layer appears, (f) a gate electrode formed on an exposed surface of the schottky layer in the recess, and (g) source and drain electrodes formed on the contact layer so that the gate electrode is located between the source and drain electrodes.

There is still further provided a hetero-junction field effect transistor including (a) a buffer layer formed on a substrate, (b) a channel layer formed on the buffer layer and composed of a first semiconductor containing n-type impurity therein at least partially in a thickness-wise direction thereof, (c) a schottky layer formed on the channel layer and composed of a second semiconductor including a forbidden band having a greater width than a width of a forbidden band of the first semiconductor, (d) a surface layer formed on the schottky layer and composed of a third semiconductor including a forbidden band having a greater width than a width of a forbidden band of the first semiconductor, (e) an electron donating layer formed on the surface layer and having smaller electron affinity than that of the channel layer, (f) a contact layer formed on the electron donating layer and composed of one of the first semiconductor and a fourth semiconductor including a forbidden band having a smaller width than a width of a forbidden band of the first semiconductor, the contact layer containing n-type impurity therein, the electron donating layer, the contact layer, and the surface layer being formed with a recess such that the schottky layer appears, (h) a gate electrode formed on an exposed surface of the schottky layer in the recess, and (i) source and drain electrodes formed on the contact layer so that the gate electrode is located between the source and drain electrodes.

It is preferable that the gate electrode is formed in the recess in contact with the surface layer.

There is yet further provided a hetero-junction field effect transistor including (a) a buffer layer formed on a substrate, (b) a channel layer formed on the buffer layer and composed of a first semiconductor containing n-type impurity therein at least partially in a thickness-wise direction thereof, (c) a schottky layer formed on the channel layer and composed of a second semiconductor including a forbidden band having a greater width than a width of a forbidden band of the first semiconductor, (d) a surface layer formed on the schottky layer and composed of a third semiconductor including a forbidden band having a greater width than a width of a forbidden band of the first semiconductor, (e) an electron donating layer formed on the surface layer and composed of a fourth semiconductor including a forbidden band having a greater width than a width of a forbidden band of the first semiconductor, the fourth semiconductor containing n-type impurity therein at least partially in a thickness-wise direction thereof, (f) a contact layer formed on the electron donating layer and composed of one of the first semiconductor and a fifth semiconductor including a forbidden band having a smaller width than a width of a forbidden band of the first semiconductor, the contact layer containing n-type impurity therein, the electron donating layer, the contact layer, and the surface layer being formed with a recess such that the schottky layer appears, (h) a gate electrode formed on an exposed surface of the schottky layer in the recess, and (i) source and drain electrodes formed on the contact layer so that the gate electrode is located between the source and drain electrodes.

Hereinbelow is explained how parasitic resistance in FET, such as source and drain resistances, is reduced, with reference to FIG. 1. Since the source and drain resistances are originated from a common source, only the source resistance is explained hereinbelow.

The source resistance is comprised of a vertical resistance component ranging from the source electrode 17 to the channel layer 13, and a horizontal resistance component in the channel layer 13 ranging from a region located just below the source electrode 17 to a channel region located just below the gate electrode 18.

The vertical resistance component is dependent on a height of a potential barrier defined by the n-type GaAs contact layer 15, the n-type AlGaAs schottky layer 14, and the n-type GaAs channel layer 13. The smaller a height of the potential barrier is, the smaller number of electrons bounce off the potential barrier, resulting in reduction in the source resistance. The potential barrier can be designed to have a smaller height by increasing an impurity concentration in the n-type AlGaAs schottky layer 14 sandwiched between the n-type GaAs contact layer 15 and the n-type GaAs channel layer 13, resulting in reduction in the vertical resistance component.

Figure 3:
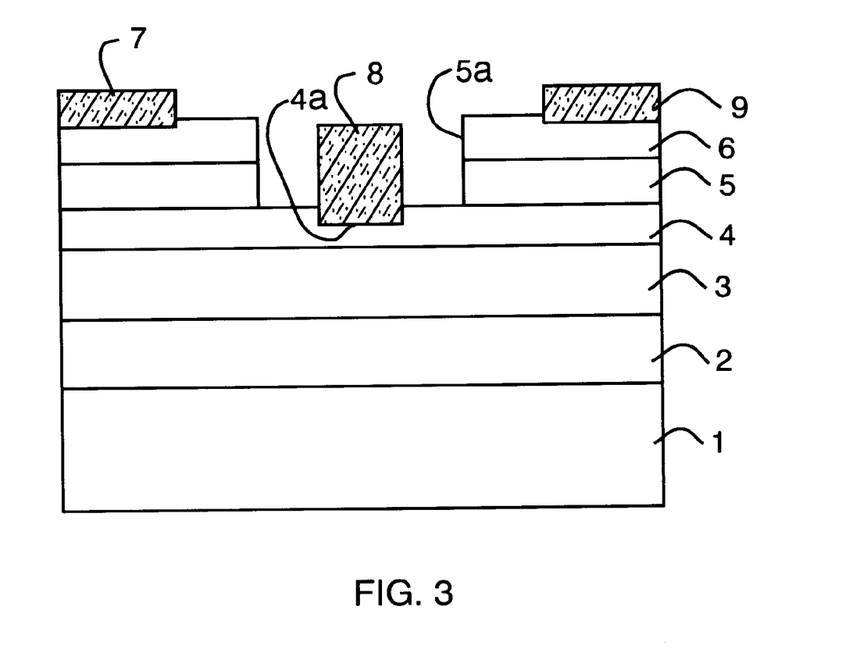
FIG. 3 is a cross-sectional view of a hetero-junction field effect transistor in accordance with the first embodiment of the present invention.

In the field effect transistor in accordance with the present invention, the vertical resistance component is reduced by forming an electron donating layer 5 between a schottky layer 4 and a contact layer 6, as illustrated in FIG. 3. Herein, an electron donating layer indicates a layer which is composed of a semiconductor including a forbidden band having a width greater than a width of forbidden band of a first semiconductor of which a channel layer is composed, and which contains n-type impurity entirely or partially in a thickness-wise direction thereof The electron donating layer has a smaller electron affinity than that of the channel layer. The formation of the electron donating layer makes it possible to reduce a height of a potential barrier to be formed in the schottky layer 4 and in the vicinity of the schottky layer 4, and accomplish a smooth profile in the potential barrier.

Referring to FIG. 2, the horizontal parasitic resistance can be reduced by increasing an electron concentration or electron mobility in the channel layer 13 ranging from a region located immediately below the source electrode 17 to a region located immediately below the gate electrode 18.

In the field effect transistor in accordance with the present invention, the horizontal parasitic resistance is reduced by additionally forming an n-type electron donating layer to thereby induce generation of a secondary electron gas.

Figure 4:
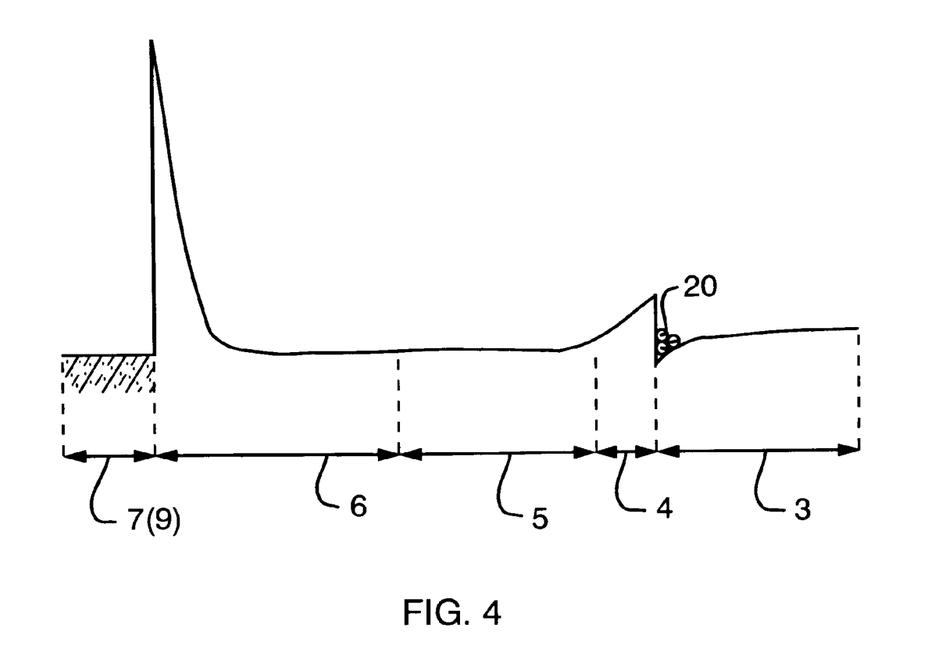
FIG. 4 is an energy band diagram of a conduction band located below an ohmic electrode in the hetero-junction field effect transistor in accordance with the first embodiment.

Specifically, as illustrated in FIG. 4, the formation of the n-type electron donating layer induces generation of a secondary electron gas in the vicinity of an interface between the n-type channel layer 3 and the schottky layer 4. The thus generated secondary electron gas causes electrons in the n-type channel layer 3 to have a greater concentration of electrons than that of a conventional HFET as illustrated in FIG. 1.

In addition, since electrons are suppressed from being scattered by virtue of the electron shielding effect in the secondary electron gas, electron mobility is also increased.

Thus, the parasitic resistance having a horizontal profile in the n-type channel layer 3 can be reduced due to a synergetic effect of increases in both concentration of electrons and electron mobility.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

FIG. 3 illustrates a cross-section of a hetero-junction field effect transistor in accordance with the first embodiment.

The hetero-junction field effect transistor in accordance with the first embodiment is comprised of a highly resistive substrate 1, a buffer layer 2 formed on the substrate 1, an n-type channel layer 3 formed on the buffer layer 2 and composed of first semiconductor containing n-type impurity therein at least partially in a thickness-wise direction thereof, a schottky layer 4 formed on the n-type channel layer 3 and composed of a second semiconductor including a forbidden band having a greater width than a width of a forbidden band of the first semiconductor, an n-type electron donating layer 5 formed on the schottky layer 4 and composed of a third semiconductor which includes a forbidden band having a greater width than a width of a forbidden band of the first semiconductor and which contains n-type impurity therein at least partially in a thickness-wise direction thereof, and an n-type contact layer 6 formed on the n-type electron donating layer 5 and composed of the first semiconductor or a fourth semiconductor including a forbidden band having a smaller width than a width of a forbidden band of the first semiconductor.

The n-type electron donating layer 5 and the n-type contact layer 6 are formed with a first recess 5a such that the schottky layer 4 appears. The schottky layer 4 is formed at an exposed surface thereof with a second recess 4a. A gate electrode 8 is formed on the schottky layer 4 in the second recess 4a within the first recess 5a. Source and drain electrodes 7 and 9 are formed on the n-type contact layer 6 so that the gate electrode 8 is located between the source and drain electrodes 7 and 9.

As is obvious in comparison with the conventional HFET illustrated in FIG. 1, the HFET in accordance with the first embodiment is provided additionally with the n-type electron donating layer 5 sandwiched between the schottky layer 4 and the n-type contact layer 6.

Similarly to the conventional the HFET illustrated in FIG. 1, HFET in accordance with the first embodiment includes the schottky layer 4 and the n-type channel layer 3 below the gate electrode 8. Hence, it is possible to have a high gate breakdown voltage by designing the semiconductor of which the schottky layer 4 is composed to have a forbidden band having a width greater than a width of a forbidden band of the n-type channel layer 3, similar to the conventional HFET illustrated in FIG. 1.

The addition of the n-type electron donating layer 5 provides such an energy band diagram of a conduction band located immediately below the source electrode 7 or the drain electrode 9 as illustrated in FIG. 4. In FIG. 4, the semiconductor of which the n-type electron donating layer 5 is composed is designed to have a forbidden band having a width gradually decreasing from a first interface between the n-type electron donating layer 5 and the schottky layer 4 towards a second interface between the n-type electron donating layer 5 and the n-type contact layer 6, and is designed not to have a discontinuity in a conduction band thereof at both the above-mentioned first and second interfaces. As is obvious in FIG. 4, the addition of the n-type electron donating layer 5 presents a smooth potential profile in the range of the n-type contact layer 6 to the n-type channel layer 3, resulting in reduction of the vertical parasitic resistance.

In addition, as illustrated in FIG. 4, a secondary gas 20 is induced to in the n-type channel layer 3 in the vicinity of an interface with the schottky layer 4. By virtue of the secondary gas 20, a concentration of total electrons in the n-type channel layer 3 is increased beyond a concentration of total electrons in the HFET illustrated in FIG. 1.

Furthermore, electrons are suppressed from being scattered by virtue of electron shielding effect in the secondary an electron gas 20, which would bring an advantage of an increase in electron mobility.

Thus, the horizontal parasitic resistance in the n-type channel layer 3 can be reduced due to a synergetic effect of increases in both concentration of electrons and electron mobility.

[Second Embodiment]

Figure 6:
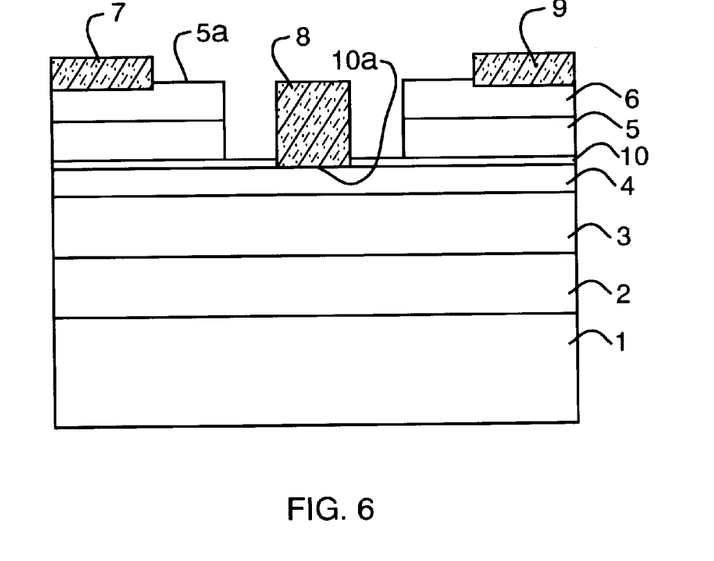
FIG. 6 is a cross-sectional view of a hetero-junction field effect transistor in accordance with the second embodiment of the present invention.

FIG. 6 illustrates a cross-section of hetero-junction field effect transistor in accordance with the second embodiment.

The hetero-junction field effect transistor in accordance with the second embodiment is comprised of a highly resistive substrate 1, a buffer layer 2 formed on the substrate 1, an n-type channel layer 3 formed on the buffer layer 2 and composed of a first semiconductor containing n-type impurity therein at least partially in a thickness-wise direction thereof, a schottky layer 4 formed on the n-type channel layer 3 and composed of a second semiconductor including a forbidden band having a greater width than a width of a forbidden band of the first semiconductor, a surface layer 10 formed on the schottky layer 4 and compose of a third semiconductor including a forbidden band having a greater width than a width of a forbidden band of the first semiconductor, an n-type electron donating layer 5 formed on the surface layer 10 and composed of a fourth, semiconductor including a forbidden band having a greater width than a width of a forbidden band of the first semiconductor, and an n-type contact layer 6 formed on the n-type electron donating layer 5 and composed of the first semiconductor or a fifth semiconductor including a forbidden band having a smaller width than a width of a forbidden band of the first semiconductor.

The n-type electron donating layer 5 and the n-type contact layer 6 are formed with a first recess 5a such that the surface layer 10 appears. The surface layer 10 is formed at an exposed surface thereof with a second recess 10a. A gate electrode 8 is formed on the schottky layer 4 in the second recess 10a within the first recess 5a. Source and drain electrodes 7 and 9 are formed on the n-type contact layer 6 so that the gate electrode 8 is located between the source and drain electrodes 7 and 9.

The HFET in accordance with the second embodiment is structurally different from the HFET in accordance with the first embodiment illustrated in FIG. 3 in that the HFET in accordance with the second embodiment is designed to additionally include the surface layer 10 between the schottky layer 4 and the n-type electron donating layer 5. As illustrated in FIG. 6, the surface layer 10 is exposed around the gate electrode 8 in the first recess 5a, and the gate electrode 8 is formed in the second recess 10a in contact with the schottky layer 4.

Figure 7:
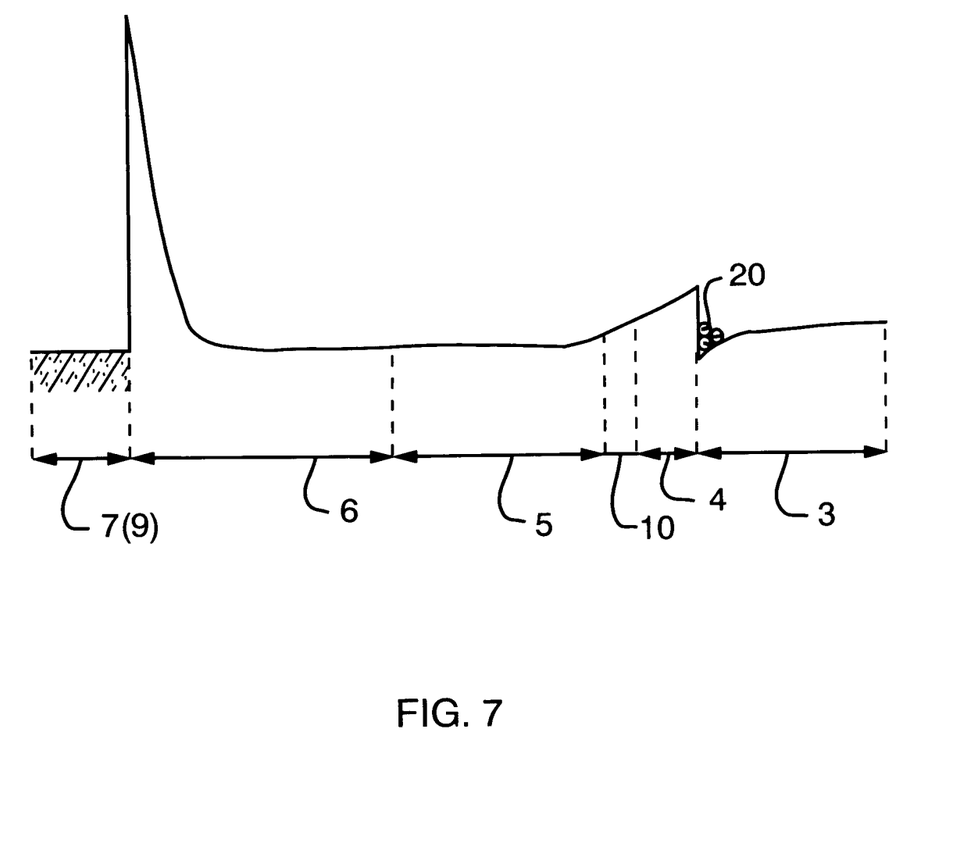
FIG. 7 is an energy band diagram of a conduction band located below an ohmic electrode in the hetero-junction field effect transistor in accordance with the second embodiment.

FIG. 7 is an energy band diagram of a conduction band located immediately below the source electrode 7 or the drain electrode 9. Similar to FIG. 4, the addition of the n-type electron donating layer 5 presents a smooth potential profile in the range of the n-type contact layer 6 to the n-type channel layer 3, resulting in reduction the vertical parasitic resistance.

In addition, as illustrated in FIG. 7, a secondary gas 20 is induced or generated in the n-type channel layer 3 in the vicinity of an interface with the schottky layer 4. By virtue of the secondary gas 20, a concentration of total electrons in the n-type channel layer 3 is increased beyond a concentration of total electrons in the HFET illustrated in FIG. 1.

Furthermore, electrons are suppressed from being scattered by virtue of electron shielding effect in the secondary electron gas 20, which would bring the advantage of an increase in electron mobility.

Thus, the horizontal parasitic resistance in the n-type channel layer 3 can be reduced due to a synergetic effect of increases in both concentration of electrons and electron mobility, similarly to the first embodiment.

By suitably selecting the semiconductor of which the surface layer 10 is to be composed, it would be possible to etch in selected regions between the n-type electron donating layer 5 and the surface layer 10 and further between the surface layer 10 and the schottky layer 4. As a result, it would be possible to accomplish steps with high accuracy, of exposing the surface layer 10 for forming the first recess 5a and exposing the schottky layer 4 for forming the second recess 10a.

Hereinbelow are explained structures of the above-mentioned hetero-junction field effect transistors in detail in connection with examples.

[First Example]

Hereinbelow is explained a first example with reference to FIG. 3.

In the first example, there is used a semi-insulating GaAs substrate as the highly resistive substrate 1. However, it should be noted that the substrate 1 may be composed of other materials in dependence on usage of the HFET.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2 \times 10^{17}$ cm$^{-3}$ and having a thickness of 170 nm.

The schottky layer 4 formed on the n-type channel layer 3 is comprised of an n-type $Al_XGa_{1-X}As$ ($0 \leq X \leq 1$) layer containing silicon at $1 \times 10^{17}$ cm$^{-3}$ and having a thickness of 20 nm. For instance, X indicating a composition rate of Al may be determined equal to 0.2.

The n-type electron donating layer 5 formed on the schottky layer 4 is comprised of an n-type $Al_XGa_{1-X}As$ layer containing silicon at $2 \times 10^{18}$ cm$^{-3}$ and having a thickness of 150 nm. A composition rate of Al in the n-type electron donating layer 5 is designed to gradually decrease from an interface between the electron donating layer 5 and the schottky layer 4 towards an interface between the electron donating layer 5 and the n-type contact layer 6 in a thickness-wise direction thereof. For instance, the composition rate of Al in the n-type electron donating layer 5 is designed to successively decrease from 0.2 to 0.0.

The n-type contact layer 6 is comprised of an n-type GaAs layer containing silicon at $2 \times 10^{18}$ cm$^{-3}$ and having a thickness of 120 nm.

The above-mentioned structure of a HFET in accordance with the first example ensures no potential barriers in an interface between the schottky layer 4 and the n-type electron donating layer 5, and further in an interface between the n-type electron donating layer 5 and the n-type contact layer 6. As a result, as illustrated in FIG. 4, it is possible to obtain a smooth energy band of a conduction band ranging from the schottky layer 4 to the n-type contact layer 6. Hence, a lower resistance is ensured in vertical electrical conduction.

As illustrated in FIG. 4, the secondary electron gas 20 is induced in the n-type channel layer 3 in the vicinity of an interface with the schottky layer 4. The secondary electron gas 20 increases a horizontal electron density along the n-type channel layer 3. In addition, electron mobility is enhanced by virtue of the electron shielding effect. As a result, it is possible to reduce a horizontal electrical resistance along the n-type channel layer 3.

Figure 5:
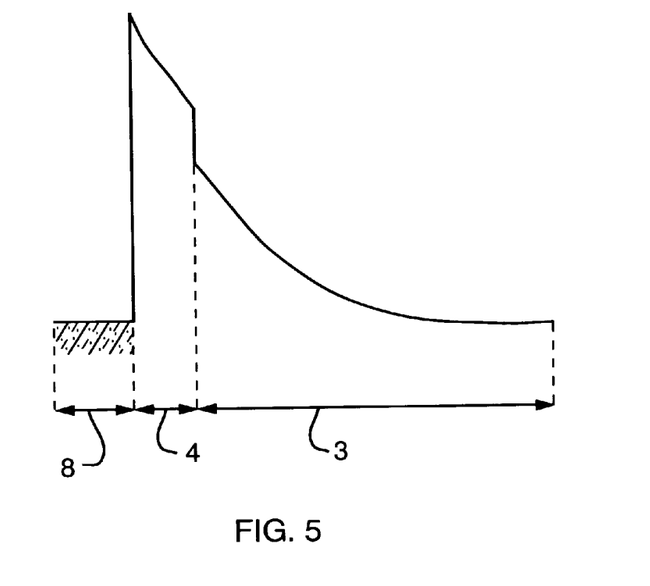
FIG. 5 is an energy band diagram of a conduction band located below a gate electrode in the hetero-junction field effect transistor in accordance with the first embodiment.

The n-type contact layer 6 and the n-type electron donating layer 5 are formed with the first recess 5a, in which the schottky layer 4 appears. The gate electrode 8 is formed on the schottky layer 4 in schottky contact. The gate electrode 8 eliminates the secondary electron gas that existed in a region of the n-type channel layer 3, located below the gate electrode 8, in the vicinity of an interface with the schottky layer 4. As a result, there is obtained such an energy band diagram of a conduction band as illustrated in FIG. 5, which diagram is similar to that of a conventional HFET.

The gate electrode 8 may be comprised of a tungsten silicide (WSi) layer formed by sputtering, for instance. For instance, the gate electrode 8 is designed to have a length of 1 μm. The gate electrode 8 may be formed on the schottky layer 4 at an interfacial surface between the schottky layer 4 and the n-type electron donating layer 5. As an alternative, as illustrated in FIG. 3, the gate electrode 8 may be formed on the schottky layer 4 so that the gate electrode 8 is partially buried in the second recess 4a formed at a surface of the schottky layer 4.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently small contact resistance to n-type GaAs of which the contact layer 6 is composed.

In accordance with a HFET as in the first example having the above-mentioned structure, a maximum drain current was 350 mA per 1 mm of a gate width, and a mutual conductance was 150 mS. A source resistance was 1.3 Ωmm.

On the other hand, in a conventional HFET having been fabricated in accordance with the same process as that of the first example, but not having been provided with the n-type electron donating layer 5, a maximum drain current was 320 mA per 1 mm of a gate width, and a mutual conductance was 120 mS. A source resistance was 1.9 Ωmm.

Thus, it was confirmed that a HFET in accordance with the first example had a low parasitic resistance, and hence, had enhanced performances as a FET.

[Second Example]

Hereinbelow is explained a second example with reference to FIG. 3.

In the second example, there is used a semi-insulating GaAs substrate as the highly resistive substrate 1, similar to the first example.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2 \times 10^{17}$ cm$^{-3}$ and having a thickness of 170 nm.

The schottky layer 4 formed on the n-type channel layer 3 is comprised of an n-type $Al_XGa_{1-X}As$ ($0 \leq X \leq 1$) layer containing silicon at $1 \times 10^{17}$ cm$^{-}$ and having a thickness of 20 nm. For instance, X indicating a composition rate of Al may be determined equal to 0.2.

The n-type electron donating layer 5 formed on the schottky layer 4 is comprised of an n-type $In_XGa_{1-X}As_YP_{1-Y}$ ($0 \leq X \leq 1, 0 \leq Y \leq 1$) layer containing silicon at $2 \times 10^{18}$ cm$^{-3}$ and having a thickness of 150 nm. The quaternary semiconductor $In_XGa_{1-X}As_YP_{1-Y}$ is designed to have a composition in lattice-matching with GaAs. A composition rate (1−X) of Ga in the n-type electron donating layer 5 is designed to gradually increase from an interface between the electron donating layer 5 and the schottky layer 4 towards an interface between the electron donating layer 5 and the n-type contact layer 6 in a thickness-wise direction thereof. For instance, the composition rate (1−X) of Ga in the n-type electron donating layer 5 is designed to successively increase from 0.51 to 1.0.

The n-type contact layer 6 formed on the n-type electron donating layer 5 is comprised of an n-type GaAs layer containing silicon at $2 \times 10^{18}$ cm$^{-3}$ and having a thickness of 120 nm.

The above-mentioned structure of a HFET in accordance with the second example ensures no potential barriers in an interface between the schottky layer 4 and the n-type electron donating layer 5, and further in an interface between the n-type electron donating layer 5 and the n-type contact layer 6. As a result, as illustrated in FIG. 4, it is possible to obtain a smooth energy band of a conduction band ranging from the schottky layer 4 to the n-type contact layer 6. Hence, a lower resistance is ensured in vertical electrical conduction.

As illustrated in FIG. 4, the secondary electron gas 20 is induced in the n-type channel layer 3 in the vicinity of an interface with the schottky layer 4. The secondary electron gas 20 increases a horizontal electron density along the n-type channel layer 3. In addition, electron mobility is enhanced by virtue of the electron shielding effect. As a result, it is possible to reduce a horizontal electrical resistance along the n-type channel layer 3.

The n-type contact layer 6 and the n-type electron donating layer 5 are formed with the first recess 5a, in which the schottky layer 4 appears. The gate electrode 8 is formed on the schottky layer 4 in schottky contact. The first recess 5a may be accurately formed, for instance, by wet-etching the n-type contact layer 6 and the n-type electron donating layer 5 in a selected region with hydrochloric acid.

The gate electrode 8 eliminates the secondary electron gas that existed in a region of the n-type channel layer 3, located below the gate electrode 8, in the vicinity of an interface with the schottky layer 4. As a result, there is obtained such an energy band diagram of a conduction band as illustrated in FIG. 5, which diagram is similar to that of a conventional HFET.

The gate electrode 8 may be comprised of a tungsten silicide (WSi) layer formed by sputtering, for instance. For instance, the gate electrode 8 is designed to have a length of 1 μm. The gate electrode 8 may be formed on the schottky layer 4 at an interfacial surface between the schottky layer 4 and the n-type electron donating layer 5. As an alternative, as illustrated in FIG. 3, the gate electrode 8 may be formed on the schottky layer 4 so that the gate electrode 8 is partially buried in the second recess 4a formed at a surface of the schottky layer 4.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently small contact resistance to n-type GaAs of which the contact layer 6 is composed.

In accordance with a HFET as in the second example having the above-mentioned structure, a maximum drain current was 345 mA per 1 mm of a gate width, and a mutual conductance was 155 mS. A source resistance was 1.3 Ωmm.

On the other hand, in a conventional HFET having been fabricated in accordance with the same process as that of the second example, but not having been provided with the n-type electron donating layer 5, a maximum drain current was 320 mA per 1 mm of a gate width, and a mutual conductance was 120 mS. A source resistance was 1.9 Ωmm.

Thus, it was confirmed that a HFET in accordance with the second example had a low parasitic resistance, and hence, had enhanced performances as a FET.

[Third Example]

Hereinbelow is explained a third example with reference to FIG. 3.

In the third example, there is used a semi-insulating GaAs substrate as the highly resistive substrate 1, similar to the first example.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2\times10^{17}$ cm$^{-3}$ and having a thickness of 170 nm.

The schottky layer 4 formed on the n-type channel layer 3 is comprised of an n-type $In_xGa_{1-x}P$ ($0\leq X\leq 1$) layer containing silicon at $1\times10^{17}$ cm$^{-3}$ and having a thickness of 20 nm. For instance, (1−X) indicating a composition rate of Ga may be determined equal to 0.51.

The n-type electron donating layer 5 formed on the schottky layer 4 is comprised of an n-type $Al_xGa_{1-x}As$ ($0\leq X\leq 1$) layer containing silicon at $2\times10^{18}$ cm$^{-3}$ and having a thickness of 150 nm. A composition rate X of Al in the n-type electron donating layer 5 is designed to gradually decrease from an interface between the electron donating layer 5 and the schottky layer 4 towards an interface between the electron donating layer 5 and the n-type contact layer 6 in a thickness-wise direction thereof. For instance, the composition rate X of Al in the n-type electron donating layer 5 is designed to successively decrease from 0.2 to 0.0.

The n-type contact layer 6 formed on the n-type electron donating layer 5 is comprised of an n-type GaAs layer containing silicon at $2\times10^{18}$ cm$^{-3}$ and having a thickness of 120 nm.

The above-mentioned structure of a HFET in accordance with the third example ensures no potential barriers in an interface between the schottky layer 4 and the n-type electron donating layer 5, and further in an interface between the n-type electron donating layer 5 and the n-type contact layer 6. As a result, as illustrated in FIG. 4, it is possible to obtain a smooth energy band of a conduction band ranging from the schottky layer 4 to the n-type contact layer 6. Hence, a lower resistance is ensured in vertical electrical conduction.

As illustrated in FIG. 4, the secondary electron gas 20 is induced in the n-type channel layer 3 in the vicinity of an interface with the schottky layer 4. The secondary electron gas 20 increases a horizontal electron density along the n-type channel layer 3. In addition, electron mobility is enhanced by virtue of the electron shielding effect. As a result, it is possible to reduce a horizontal electrical resistance along the n-type channel layer 3.

The n-type contact layer 6 and the n-type electron donating layer 5 are formed with the first recess 5a, in which the schottky layer 4 appears. The gate electrode 8 is formed on the schottky layer 4 in schottky contact. The first recess 5a may be accurately formed, for instance, by wet-etching the n-type contact layer 6 and the n-type electron donating layer 5 in a selected region with phosphoric acid.

The gate electrode 8 eliminates the secondary electron gas that existed in a region of the n-type channel layer 3, located below the gate electrode 8, in the vicinity of an interface with the schottky layer 4. As a result, there is obtained such an energy band diagram of a conduction band as illustrated in FIG. 5, which diagram is similar to that of a conventional HFET.

The gate electrode 8 may be comprised of a tungsten silicide (WSi) layer formed by sputtering, for instance. For instance, the gate electrode 8 is designed to have a length of 1 μm. The gate electrode 8 may be formed on the schottky layer 4 at an interfacial surface between the schottky layer 4 and the n-type electron donating layer 5. As an alternative, as illustrated in FIG. 3, the gate electrode 8 may be formed on the schottky layer 4 so that the gate electrode 8 is partially buried in the second recess 4a formed at a surface of the schottky layer 4.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently mall contact resistance to n-type GaAs of which the contact layer 6 is composed.

In accordance with the HFET as the third example having the above-mentioned structure, a maximum drain current was 350 mA per 1 mm of a gate width, and a mutual conductance was 155 mS. A source resistance was 1.35 Ωmm.

On the other hand, in a conventional HFET having been fabricated in accordance with the same process as that of the third example, but not having been provided with the n-type electron donating layer 5, a maximum drain current was 325 mA per 1 mm of a gate width, and a mutual conductance was 125 mS. A source resistance was 1.85 Ωmm.

Thus, it was confirmed that a HFET in accordance with the second example had a low parasitic resistance, and hence, had enhanced performances as a FET.

[Fourth Example]

Hereinbelow is explained a fourth example with reference to FIG. 3.

In the fourth example, there is used a semi-insulating GaAs substrate as the highly resistive substrate 1, similar to the first example.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2\times10^{17}$ cm$^{-3}$ and having a thickness of 170 nm.

The schottky layer 4 formed on the n-type channel layer 3 is comprised of an n-type $In_XGa_{1-X}P$ ($0 \leq X \leq 1$) layer containing silicon at $1\times10^{17}$ cm$^{-3}$ and having a thickness of 20 nm. For instance, (1−X) indicating a composition rate of Ga may be determined equal to 0.51.

The n-type electron donating layer 5 formed on the schottky layer 4 is comprised of an n-type $In_XGa_{1-X}As_YP_{1-Y}$ ($0 \leq X \leq 1$, $0 \leq Y \leq 1$) layer containing silicon at $2\times10^{18}$ cm$^{-3}$ and having a thickness of 150 nm. The quaternary semiconductor $In_XGa_{1-X}As_YP_{1-Y}$ is designed to have a composition in lattice-matching with GaAs. A composition rate (1−X) of Ga in the n-type electron donating layer 5 is designed to gradually increase from an interface between the electron donating layer 5 and the schottky layer 4 towards an interface between the electron donating layer 5 and the n-type contact layer 6 in a thickness-wise direction thereof. For instance, the composition rate (1−X) of Ga in the n-type electron donating layer 5 is designed to successively increase from 0.51 to 1.0.

The n-type contact layer 6 formed on the n-type electron donating layer 5 is comprised of an n-type GaAs layer containing silicon at $2\times10^{18}$ cm$^{-3}$ and having a thickness of 120 nm.

The above-mentioned structure of a HFET in accordance with the fourth example ensures a smooth energy band of a conduction band ranging from the schottky layer 4 to the n-type contact layer 6, as illustrated in FIG. 4, similar to the first to third examples. Hence, a lower resistance is ensured in vertical electrical conduction.

As illustrated in FIG. 4, the secondary electron gas 20 is induced to generate in the n-type channel layer 3 in the vicinity of an interface with the schottky layer 4. The secondary electron gas 20 increases a horizontal electron density along the n-type channel layer 3. In addition, electron mobility is enhanced by virtue of the electron shielding effect. As a result, it is possible to reduce a horizontal electrical resistance along the n-type channel layer 3.

The n-type contact layer 6 and the n-type electron donating layer 5 are formed with the first recess 5a, in which the schottky layer 4 appears. The gate electrode 8 is formed on the schottky layer 4 in schottky contact. The first recess 5a may be accurately formed, for instance, by wet-etching the n-type contact layer 6 and the n-type electron donating layer 5 in a selected region with hydrochloric acid.

The gate electrode 8 eliminates the secondary electron gas that existed in a region of the n-type channel layer 3, located below the gate electrode 8, in the vicinity of an interface with the schottky layer 4. As a result, there is obtained such an energy band diagram of a conduction band as illustrated in FIG. 5, which diagram is similar to that of a conventional HFET.

The gate electrode 8 may be comprised of a tungsten silicide (WSi) layer formed by sputtering, for instance. For instance, the gate electrode 8 is designed to have a length of 1 μm. The gate electrode 8 may be formed on the schottky layer 4 at an interfacial surface between the schottky layer 4 and the n-type electron donating layer 5. As an alternative, as illustrated in FIG. 3, the gate electrode 8 may be formed on the schottky layer 4 so that the gate electrode 8 is partially buried in the second recess 4a formed at a surface of the schottky layer 4.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently small contact resistance to n-type GaAs of which the contact layer 6 is composed.

In accordance with the HFET as in the fourth example having the above-mentioned structure, a maximum drain current was 345 mA per 1 mm of a gate width, and a mutual conductance was 150 mS. A source resistance was 1.3 Ωmm.

On the other hand, in a conventional HFET having been fabricated in accordance with the same process as that of the fourth example, but not having been provided with the n-type electron donating layer 5, a maximum drain current was 325 mA per 1 mm of a gate width, and a mutual conductance was 125 mS. A source resistance was 1.85 Ωmm.

Thus, it was confirmed that a HFET in accordance with the fourth example had a low parasitic resistance, and hence, had enhanced performances as a FET.

[Fifth Example]

Hereinbelow is explained a fifth example with reference to FIG. 6.

In the fifth example, there is used a semi-insulating GaAs substrate as the highly resistive substrate 1, similarly to the first example.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2\times10^{17}$ cm$^{-3}$ and having a thickness of 170 nm.

The schottky layer 4 formed on the n-type channel layer 3 is comprised of an n-type $Al_XGa_{1-X}As$ ($0 \leq X \leq 1$) layer containing silicon at $1\times10^{17}$ cm$^{-3}$ and having a thickness of 16 nm. For instance, X indicating a composition rate of Al may be determined equal to 0.2.

The surface layer 10 formed on the schottky layer 4 is comprised of an n-type $In_XGa_{1-X}P$ ($0 \leq X \leq 1$) layer containing silicon at $1\times10^{17}$ cm$^{-3}$ and having a thickness of 4 nm. For instance, (1−X) indicating a composition rate of Ga may be determined equal to 0.51.

The n-type electron donating layer 5 formed on the surface layer 10 is comprised of an n-type $Al_XGa_{1-X}As$ ($0 \leq X \leq 1$) layer containing silicon at $2\times10^{18}$ cm$^{-3}$ and having a thickness of 150 nm. A composition rate X of Al in the n-type electron donating layer 5 is designed to gradually decrease from an interface between the electron donating layer 5 and the surface layer 10 towards an interface between the electron donating layer 5 and the n-type contact layer 6 in a thickness-wise direction thereof For instance, the composition rate X of Al in the n-type electron donating layer 5 is designed to successively decrease from 0.2 to 0.0.

The n-type contact layer 6 formed on the n-type electron donating layer 5 is comprised of an n-type GaAs layer containing silicon at $2\times10^{18}$ cm$^{-3}$ and having a thickness of 120 nm.

The above-mentioned structure of a HFET in accordance with the fifth example ensures a smooth energy band of a conduction band ranging from the schottky layer 4 to the n-type contact layer 6, as illustrated in FIG. 7. Hence, a lower resistance is ensured in vertical electrical conduction.

As illustrated in FIG. 7, the secondary electron gas 20 is generated in the n-type channel layer 3 in the vicinity of an interface with the schottky layer 4. The secondary electron gas 20 increases a horizontal electron density along the n-type channel layer 3. In addition, electron mobility is enhanced by virtue of the electron shielding effect. As a result, it is possible to reduce a horizontal electrical resistance along the n-type channel layer 3.

The n-type contact layer 6 and the n-type electron donating layer 5 are formed with the first recess 5a, in which the surface layer 10 appears. The surface layer 10 is formed with the second recess 10a within the first recess 5a. The gate electrode 8 is formed on the schottky layer 4 in schottky contact in the second recess 10a further in the first recess 5a. The first recess 5a may be formed, for instance, by wet-etching the n-type contact layer 6 and the n-type electron donating layer 5 in a selected region with phosphoric acid, and the second recess 10a may be formed, for instance, by wet-etching the surface layer 10 with hydrochloric acid. Such wet etching ensures a high selection ratio to thereby enable the surface layer 10 and the schottky layer 4 to be exposed with high accuracy.

The gate electrode 8 eliminates the secondary electron gas having existed in a region of the n-type channel layer 3, located below the gate electrode 8, in the vicinity of an interface with the schottky layer 4. As a result, there is obtained such an energy band diagram of a conduction band as illustrated in FIG. 5.

The gate electrode 8 may be comprised of a tungsten silicide (WSi) layer formed by sputtering, for instance. For instance, the gate electrode 8 is designed to have a length of 1 μm. The gate electrode 8 may be formed on the surface layer 10 at an interfacial surface between the surface layer 10 and the n-type electron donating layer 5. As an alternative, as illustrated in FIG. 6, the gate electrode 8 may be formed on the schottky layer 4 so that the gate electrode 8 is partially buried in the second recess 10a in contact with the surface layer 10.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently small contact resistance to n-type GaAs of which the contact layer 6 is composed.

In accordance with the HFET as in the fifth example having the above-mentioned structure, a maximum drain current was 340 mA per 1 mm of a gate width, and a mutual conductance was 160 mS. A source resistance was 1.35 Ωmm.

On the other hand, in a conventional HFET having been fabricated in accordance with the same process as that of the fifth example, but not having been provided with the n-type electron donating layer 5 and the surface layer 10, a maximum drain current was 320 mA per 1 mm of a gate width, and a mutual conductance was 120 mS. A source resistance was 1.9 Ωmm.

Thus, it was confirmed that HFET in accordance with the fifth example had a low parasitic resistance, and hence, had enhanced performances as a FET.

[Sixth Example]

Hereinbelow is explained a sixth example with reference to FIG. 6.

In the sixth example, there is used a semi-insulating GaAs substrate as the highly resistive substrate 1, similar to the first example.

The buffer layer 2 formed on the semi-insulating GaAs substrate 1 is composed of GaAs containing no impurities therein, and has a thickness of 500 nm.

The n-type channel layer 3 formed on the buffer layer 2 is comprised of an n-type GaAs layer containing silicon at $2\times10^{17}$ cm$^{-3}$ and having a thickness of 170 nm.

The schottky layer 4 formed on the n-type channel layer 3 is comprised of an n-type In$_X$Ga$_{1-X}$P ($0 \leq X \leq 1$) layer containing silicon at $1\times10^{17}$ cm$^{-3}$ and having a thickness of 16 nm. For instance, (1−X) indicating a composition rate of Ga may be determined equal to 0.51.

The surface layer 10 formed on the schottky layer 4 is comprised of an n-type Al$_X$Ga$_{1-X}$As ($0 \leq X \leq 1$) layer containing silicon at $1\times10^{17}$ cm$^{-3}$ and having a thickness of 4 nm. For instance, X indicating a composition rate of Al may be determined equal to 0.2.

The n-type electron donating layer 5 formed on the surface layer 10 is comprised of an n-type In$_X$Ga$_{1-X}$As$_Y$P$_{1-Y}$ ($0 \leq X1$, $0 \leq Y \leq 1$) layer containing silicon at $2\times10^{18}$ cm$^{-3}$ and having a thickness of 150 nm. The quaternary semiconductor In$_X$Ga$_{1-X}$As$_Y$P$_{1-Y}$ is designed to have a composition in lattice-matching with GaAs. A composition rate (1−X) of Ga in the n-type electron donating layer 5 is designed to gradually increase from an interface between the electron donating layer 5 and the surface layer 10 towards an interface between the electron donating layer 5 and the n-type contact layer 6 in a thickness-wise direction thereof. For instance, the composition rate (1−X) of Ga in the n-type electron donating layer 5 is designed to successively increase from 0.51 to 1.0.

The n-type contact layer 6 formed on the n-type electron donating layer 5 is comprised of an n-type GaAs layer containing silicon at $2\times10^{18}$ cm$^{-3}$ and having a thickness of 120 nm.

The above-mentioned structure of a HFET in accordance with the sixth example ensures a smooth energy band of a conduction band ranging from the schottky layer 4 to the n-type contact layer 6, as illustrated in FIG. 7, similarly to the fifth example. Hence, a lower resistance is ensured in vertical electrical conduction.

As illustrated in FIG. 7, the secondary electron gas 20 is induced or generated in the n-type channel layer 3 in the vicinity of an interface with the schottky layer 4. The secondary electron gas 20 increases a horizontal electron density along the n-type channel layer 3. In addition, electron mobility is enhanced by virtue of a electron shielding effect. As a result, it is possible to reduce a horizontal electrical resistance along the n-type channel layer 3.

The n-type contact layer 6 and the n-type electron donating layer 5 are formed with the first recess 5a, in which the surface layer 10 appears. The surface layer 10 is formed with the second recess 10a within the first recess 5a. The gate electrode 8 is formed on the schottky layer 4 in schottky contact in the second recess 10a further in the first recess 5a. The first recess 5a may be formed, for instance, by wet-etching the n-type contact layer 6 and the n-type electron donating layer 5 in a selected region with phosphoric acid and thereafter with hydrochloric acid, and the second recess 10a may be formed, for instance, by wet-etching the surface layer 10 with phosphoric acid. Such wet etching ensures a high selection ratio to thereby enable the surface layer 10 and the schottky layer 4 to be exposed with high accuracy.

The gate electrode 8 eliminates the secondary electron gas having existed in a region of the n-type channel layer 3, located below the gate electrode 8, in the vicinity of an interface with the schottky layer 4. As a result, there is obtained such an energy band diagram of a conduction band as illustrated in FIG. 5.

The gate electrode 8 may be comprised of a tungsten silicide (WSi) layer formed by sputtering, for instance. For instance, the gate electrode 8 is designed to have a length of 1 μm. The gate electrode 8 may be formed on the surface layer 10 at an interfacial surface between the surface layer 10 and the n-type electron donating layer 5. As an alternative, as illustrated in FIG. 6, the gate electrode 8 may be formed on the schottky layer 4 so that the gate electrode 8 is partially buried in the second recess 10*a* in contact with the surface layer 10.

The source and drain electrodes 7 and 9 are formed on the n-type contact layer 6 both in ohmic contact such that the gate electrode 8 is located between the source and drain electrodes 7 and 9. The source and drain electrodes 7 and 9 may be composed of AuGe/Ni to which heat treatment is applied, for instance, at 400° C. for 30 seconds in order to provide a sufficiently small contact resistance to n-type GaAs of which the contact layer 6 is composed.

In accordance with a HFET as in the sixth example having the above-mentioned structure, a maximum drain current was 345 mA per 1 mm of a gate width, and a mutual conductance was 155 mS. A source resistance was 1.35 Ωmm.

On the other hand, in a conventional HFET having been fabricated in accordance with the same process as that of the sixth example, but not having been provided with the n-type electron donating layer 5 and the surface layer 10, a maximum drain current was 325 mA per 1 mm of a gate width, and a mutual conductance was 125 mS. A source resistance was 1.85 Ωmm.

Thus, it was confirmed that a HFET in accordance with the sixth example had a low parasitic resistance, and hence, had enhanced performances as a FET.

While the present invention has been described in connection with certain preferred embodiments and examples, it is to be understood that the subject matter encompassed by way of the present invention is not to be limited to those specific embodiments and examples. On the contrary, it is intended for the subject matter of the invention to include all alternatives, modifications and equivalents as can be included within the spirit and scope of the following claims.

For instance, though the n-type channel layer 3 and the n-type contact layer 6 are composed of GaAs in the above-mentioned first to sixth examples, they may be composed of InGaAs having a forbidden band having a smaller width than that of a forbidden band of GaAs.

The buffer layer 2 may be designed to have a more complicated structure having hetero-junction and super lattice structure therein.

It is not always necessary for the n-type impurity containing layer such as the channel layer 3 to have a uniform concentration profile of the n-type impurity. The concentration profile may locally vary, or may be pulse-shaped.

In addition, the composition of the $Al_XGa_{1-X}As$ ($0 \leq X \leq 1$) layer or the $In_XGa_{1-X}As_YP_{1-Y}$ ($0 \leq X \leq 1$, $0 \leq Y \leq 1$), and how the composition is modified are not to be limited to those in the embodiments and the examples.

As has been explained so far, the hetero-junction field effect transistor in accordance with the present invention is designed to include the n-type electron donating layer between the n-type contact layer composed of GaAs and the schottky layer composed of AlGaAs or InGaP. The n-type electron donating layer is composed of AlGaAs or InGaAsP, and is designed to include a forbidden band having a varying width.

As a result, there is no discontinuity in an energy band of a conduction band between the n-type contact layer and the schottky layer, or even if there were discontinuity in an energy band of a conduction band, such discontinuity does not exert a harmful influence on electron transit. Accordingly, the present invention makes it possible to significantly reduce source and drain resistance in comparison with a conventional hetero-junction field effect transistor including no n-type electron donating layer.

The hetero-junction field effect transistor in accordance with the present invention is designed to include the n-type electron donating layer and the surface layer between the n-type contact layer composed of GaAs and the schottky layer composed of AlGaAs or InGaP. The n-type electron donating layer is composed of n-type AlGaAs or n-type InGaAsP, and is designed to include a forbidden band having a varying width. The surface layer is composed of InGaP or AlGaAs.

As a result, there is no discontinuity in an energy band of a conduction band between the n-type contact layer and the schottky layer, or even if there were discontinuity in an energy band of a conduction band, such discontinuity does not exert a harmful influence on electron transit. Accordingly, the present invention makes it possible to significantly reduce source and drain resistance in comparison with a conventional hetero-junction field effect transistor including neither n-type electron donating layer nor the surface layer.

In addition, it is possible to etch the surface layer relative to both the schottky layer and the n-type electron donating layer in selected regions, which ensures that the first and second recesses 5*a* and 10*a* can be formed under control to thereby cause the surface layer 10 and the schottky layer 4 to be exposed.

The entire disclosure of Japanese Patent Application No. 10-21061 filed on Feb. 2, 1998 including specification, claims, drawings and summary is incorporated herein by reference in its entirety.

What is claimed is:

1. A hetero-junction field effect transistor comprising:
   (a) a buffer layer formed on a substrate;
   (b) a channel layer formed on said buffer layer and composed of a first semiconductor containing n-type impurity therein at least partially in a thickness-wise direction thereof;
   (c) a schottky layer formed on said channel layer and composed of a second semiconductor including a forbidden band having a greater width than a width of a forbidden band of said first semiconductor;
   (d) an electron donating layer formed on a surface of said schottky layer and having a smaller electron affinity than that of said channel layer;
   (e) a contact layer formed on said electron donating layer and composed of one of said first semiconductor and a third semiconductor including a forbidden band having smaller width than a width of a forbidden band of said first semiconductor, said contact layer containing n-type impurity therein,
      both said electron donating layer and said contact layer having a recess formed therein;
   (f) a gate electrode formed on said surface of said schottky layer in said recess formed in said electron donating layer and said contact layer; and
   (g) source and drain electrodes formed on said contact layer so that said gate electrode is located between said source and drain electrodes.

2. The hetero-junction field effect transistor as set forth in claim 1, wherein said surface of said schottky layer has a second recess formed between said source and said drain, said second recess being smaller than said first recess and being entirely contained within said first recess, said second recess having a depth that is less than a thickness of said schottky layer, said gate electrode being positioned in said second recess.

3. A hetero-junction field effect transistor comprising:
(a) a buffer layer formed on a substrate;
(b) a channel layer formed on said buffer layer and composed of a first semiconductor containing n-type impurity therein at least partially in a thickness-wise direction thereof;
(c) a schottky layer formed on said channel layer and composed of a second semiconductor including a forbidden band having a greater width than a width of a forbidden band of said first semiconductor;
(d) an electron donating layer formed on said schottky layer and having a smaller electron affinity than that of said channel layer;
(e) a contact layer formed on said electron donating layer and composed of one of said first semiconductor and a third semiconductor including a forbidden band having smaller width than a width of a forbidden band of said first semiconductor, said contact layer containing n-type impurity therein,
both said electron donating layer and said contact layer being formed with a recess;
(f) a gate electrode formed on an exposed surface of said schottky layer in said recess; and
(g) source and drain electrodes formed on said contact layer so that said gate electrode is located between said source and drain electrodes,
wherein a width of a forbidden band successively varies at both a first interface between said electron donating layer and said schottky layer and a second interface between said electron donating layer and said contact layer.

4. The hetero-junction field effect transistor as set forth in claim 3, wherein said width of a forbidden band decreases from said first interface to said second interface.

5. The hetero-junction field effect transistor as set forth in claim 3, wherein said electron donating layer is composed of a fourth semiconductor having a composition successively varying from said first interface to said second interface.

6. The hetero-junction field effect transistor as set forth in claim 5, wherein said fourth semiconductor has a composition which is the same as a composition of said second semiconductor in the vicinity of said first interface, and which is further the same as a composition of said third semiconductor in the vicinity of said second interface.

7. The hetero-junction field effect transistor as set forth in claim 5, wherein said contact layer is composed of one of GaAs and InGaAs, said schottky layer is composed of one of AlGaAs and InGaP, and said electron donating layer is composed of $Al_aGa_{1-a}As$ ($0 \leq a \leq 1$).

8. The hetero-junction field effect transistor as set forth in claim 5, wherein said contact layer is composed of one of GaAs and InGaAs, said schottky layer is composed of one of AlGaAs and InGaP, and said electron donating layer is composed of $In_bGa_{1-b}As_cP_{1-c}$ ($0 \leq b \leq 1$, $0 \leq c \leq 1$).

9. A hetero-junction field effect transistor comprising:
(a) a buffer layer formed on a substrate;
(b) a channel layer formed on said buffer layer and composed of a first semiconductor containing n-type impurity therein at least partially in a thickness-wise direction thereof;
(c) a schottky layer formed on said channel layer and composed of a second semiconductor including a forbidden band having a greater width than a width of a forbidden band of said first semiconductor;
(d) an electron donating layer formed on a surface of said schottky layer and composed of a third semiconductor including a forbidden band having a greater width than a width of a forbidden band of said first semiconductor, said third semiconductor containing n-type impurity therein at least partially in a thickness-wise direction thereof;
(e) a contact layer formed on said electron donating layer and composed of one of said first semiconductor and a fourth semiconductor including a forbidden band having a smaller width than a width of a forbidden band of said first semiconductor, said contact layer containing n-type impurity therein,
both said electron donating layer and said contact layer having a recess formed therein;
(f) a gate electrode formed on said surface of said schottky layer in said recess in said electron donating layer and said contact layer; and
(g) source and drain electrodes formed on said contact layer so that said gate electrode is located between said source and drain electrodes.

10. The hetero-junction field effect transistor as set forth in claim 9, wherein said surface of said schottky layer has a second recess formed between said source and said drain, said second recess being smaller than said first recess and being entirely contained within said first recess, said second recess having a depth that is less than a thickness of said schottky layer, said gate electrode being positioned in said second recess.

11. A hetero-junction field effect transistor comprising:
(a) a buffer layer formed on a substrate;
(b) a channel layer formed on said buffer layer and composed of a first semiconductor containing n-type impurity therein at least partially in a thickness-wise direction thereof;
(c) a schottky layer formed on said channel layer and composed of a second semiconductor including a forbidden band having a greater width than a width of a forbidden band of said first semiconductor;
(d) an electron donating layer formed on said schottky layer and composed of a third semiconductor including a forbidden band having a greater width than a width of a forbidden band of said first semiconductor said third semiconductor containing n-type impurity therein at least partially in a thickness-wise direction thereof;
(e) a contact layer formed on said electron donating layer and composed of one of said first semiconductor and a fourth semiconductor including a forbidden band having a smaller width than a width of a forbidden band of said first semiconductor, said contact layer containing n-type impurity therein,
both said electron donating layer and said contact layer being formed with a recess;
(f) a gate electrode formed on an exposed surface of said schottky layer in said recess; and
(g) source and drain electrodes formed on said contact layer so that said gate electrode is located between said source and drain electrodes,
wherein a width of a forbidden band successively varies at both a first interface between said electron donating layer and said schottky layer and a second interface between said electron donating layer and said contact layer.

12. The hetero-junction field effect transistor as set forth in claim 11, wherein said width of a forbidden band decreases from said first interface to said second interface.

13. The hetero-junction field effect transistor as set forth in claim 11, wherein said third semiconductor has a composition successively varying from said first interface to said second interface.

14. The hetero-junction field effect transistor as set forth in claim 13, wherein said third semiconductor has a composition which is the same as a composition of said second semiconductor in the vicinity of said first interface, and which is further the same as a composition of said fourth semiconductor in the vicinity of said second interface.

15. The hetero-junction field effect transistor as set forth in claim 13, wherein said contact layer is composed of one of GaAs and InGaAs, said schottky layer is composed of one of AlGaAs and InGaP, and said electron donating layer is composed of $Al_aGa_{1-a}As$ ($0 \leq a \leq 1$).

16. The hetero-junction field effect transistor as set forth in claim 13, wherein said contact layer is composed of one of GaAs and InGaAs, said schottky layer is composed of one of AlGaAs and InGaP, and said electron donating layer is composed of $In_bGa_{1-b}As_cP_{1-c}$ ($0 \leq b \leq 1$, $0 \leq c \leq 1$).

17. A hetero-junction field effect transistor comprising:
(a) a buffer layer formed on a substrate;
(b) a channel layer formed on said buffer layer and composed of a first semiconductor containing n-type impurity therein at least partially in a thickness-wise direction thereof;
(c) a schottky layer formed on said channel layer and composed of a second semiconductor including a forbidden band having a greater width than a width of a forbidden band of said first semiconductor;
(d) a surface layer formed on said schottky layer and composed of a third semiconductor including a forbidden band having a greater width than a width of a forbidden band of said first semiconductor;
(e) an electron donating layer formed on said surface layer and having a smaller electron affinity than that of said channel layer;
(f) a contact layer formed on said electron donating layer and composed of one of said first semiconductor and a fourth semiconductor including a forbidden band having a smaller width than a width of a forbidden band of said first semiconductor, said contact layer containing n-type impurity therein,
said electron donating layer, said contact layer, and said surface layer being formed with a recess;
(h) a gate electrode formed on an exposed surface of said schottky layer in said recess; and
(i) source and drain electrodes formed on said contact layer so that said gate electrode is located between said source and drain electrodes.

18. The hetero-junction field effect transistor as set forth in claim 17, wherein said gate electrode is formed in said recess in contact with said surface layer.

19. The hetero-junction field effect transistor as set forth in claim 17, wherein said schottky layer is formed at said exposed surface thereof with a second recess, said gate electrode being positioned in said second recess.

20. The hetero-junction field effect transistor as set forth in claim 17, wherein a width of a forbidden band successively varies at both a first interface between said electron donating layer and said contact layer and a second interface between said electron donating layer and said surface layer.

21. The hetero junction field effect transistor as set forth in claim 20, wherein said width of a forbidden band decreases from said second interface to said first interface.

22. The hetero-junction field effect transistor as set forth in claim 20, wherein said electron donating layer is composed of a fifth semiconductor having a composition successively varying from said second interface said first interface.

23. The hetero-junction field effect transistor as set forth in claim 22, wherein said fifth semiconductor has a composition which is the same as a composition of said fourth semiconductor in the vicinity of said first interface.

24. The hetero-junction field effect transistor as set forth in claim 22, wherein said contact layer is composed of one of GaAs and InGaAs, said schottky layer is composed of AlGaAs, said surface layer is composed of InGaP, and said electron donating layer is composed of $Al_aGa_{1-a}As$ ($0 \leq a \leq 1$).

25. The hetero-junction field effect transistor as set forth in claim 22, wherein said contact layer is composed of one of GaAs and InGaAs, said schottky layer is composed of InGaP, said surface layer is composed of AlGaAs, and said electron donating layer is composed of $In_bGa_{1-b}As_cP_{1-c}$ ($0 \leq b \leq 1$, $0 \leq c \leq 1$).

26. A hetero-junction field effect transistor comprising:
(a) a buffer layer formed on a substrate;
(b) a channel layer formed on said buffer layer and composed of a first semiconductor containing n-type impurity therein at least partially in a thickness-wise direction thereof;
(c) a schottky layer formed on said channel layer and composed of a second semiconductor including a forbidden band having a greater width than a width of a forbidden band of said first semiconductor;
(d) a surface layer formed on said schottky layer and composed of a third semiconductor including a forbidden band having a greater width than a width of a forbidden band of said first semiconductor;
(e) an electron donating layer formed on said surface layer and composed of a fourth semiconductor including a forbidden band having a greater width than a width of a forbidden band of said first semiconductor, said fourth semiconductor containing n-type impurity therein at least partially in a thickness-wise direction thereof;
(f) a contact layer formed on said electron donating layer and composed of one of said first semiconductor and a fifth semiconductor including a forbidden band having a smaller width than a width of a forbidden band of said first semiconductor, said contact layer containing n-type impurity therein,
said electron donating layer, said contact layer, and said surface layer being formed with a recess;
(h) a gate electrode formed on an exposed surface of said schottky layer in said recess; and
(i) source and drain electrodes formed on said contact layer so that said gate electrode is located between said source and drain electrodes.

27. The hetero-junction field effect transistor as set forth in claim 26, wherein said gate electrode is formed in said recess in contact with said surface layer.

28. The hetero-junction field effect transistor as set forth in claim 26, wherein said schottky layer is formed at said exposed surface thereof with a second recess, said gate electrode being positioned in said second recess.

29. The hetero-junction field effect transistor as set forth in claim 26, wherein a width of a forbidden band successively varies at both a first interface between said electron donating layer and said contact layer and a second interface between said electron donating layer and said surface layer.

30. The hetero-junction field effect transistor as set forth in claim 29, wherein said width of a forbidden band decreases from said second interface to said first interface.

31. The hetero-junction field effect transistor as set forth in claim 29, wherein said fourth semiconductor has a composition successively varying from said second interface to said first interface.

32. The hetero-junction field effect transistor as set forth in claim 31, wherein said fourth semiconductor has a composition which is the same as a composition of said fifth semiconductor in the vicinity of said first interface.

33. The hetero-junction field effect transistor as set forth in claim 31, wherein said contact layer is composed of one of GaAs and InGaAs, said schottky layer is composed of AlGaAs, said surface layer is composed of InGaP, and said electron donating layer is composed of $Al_aGa_{1-a}As$ ($0 \leq a \leq 1$).

34. The hetero-junction field effect transistor as set forth in claim 31, wherein said contact layer is composed of one of GaAs and InGaAs, said schottky layer is composed of InGaP, said surface layer is composed of AlGaAs, and said electron donating layer is composed of $In_bGa_{1-b}As_cP_{1-c}$ ($0 \leq b \leq 1$, $0 \leq c \leq 1$).

* * * * *